United States Patent [19]

Yanase et al.

[11] Patent Number: 4,636,821
[45] Date of Patent: Jan. 13, 1987

[54] SURFACE-EMITTING SEMICONDUCTOR ELEMENTS

[75] Inventors: Tomoo Yanase; Hiroyoshi Rangu, both of Tokyo, Japan

[73] Assignee: NEC Corporation, Tokyo, Japan

[21] Appl. No.: 581,749

[22] Filed: Feb. 21, 1984

[30] Foreign Application Priority Data

| Feb. 21, 1983 | [JP] | Japan | 58-27177 |
| Feb. 21, 1983 | [JP] | Japan | 58-27178 |
| Feb. 22, 1983 | [JP] | Japan | 58-27998 |
| Mar. 30, 1983 | [JP] | Japan | 58-54120 |
| Apr. 8, 1983 | [JP] | Japan | 58-61722 |

[51] Int. Cl.$^4$ .......................................... H01L 33/00
[52] U.S. Cl. ........................................ 357/17; 372/50
[58] Field of Search .................. 357/17; 372/43, 44, 372/50

[56] References Cited

U.S. PATENT DOCUMENTS 4,527,179 7/1985 Yamazaki ..................... 357/17

OTHER PUBLICATIONS

"Surface-Emitting GaInAsP/InP Injection Laser with Short Cavity Length"; *Electronics Letters;* vol. 18, No. 11; 5/27/82; pp. 461–463.

*Primary Examiner*—William L. Sikes
*Assistant Examiner*—Robert E. Wise
*Attorney, Agent, or Firm*—Sughrue, Mion, Zinn, Macpeak & Seas

[57] ABSTRACT

A surface-emitting semiconductor light emitting element, such as a laser or a light emitting diode, having at least one active light emitting layer on a semi-insulating substrate, with p-type and n-type semiconductor regions also on the substrate and in contact with opposite side faces of the active layer. The active layer has a narrower band gap than the semiconductor regions. The light emitting region may comprise a multilayer structure of plural active light emitting layers sandwiched between alternating p-type and n-type semiconductor layers.

15 Claims, 9 Drawing Figures

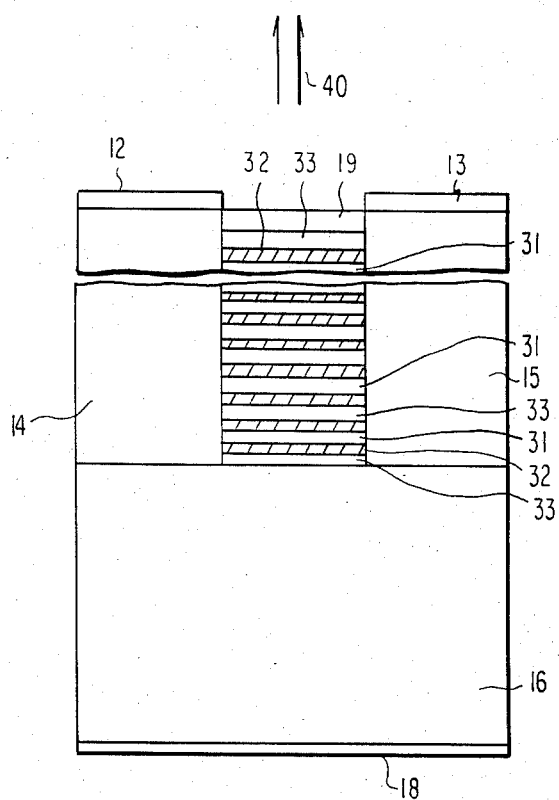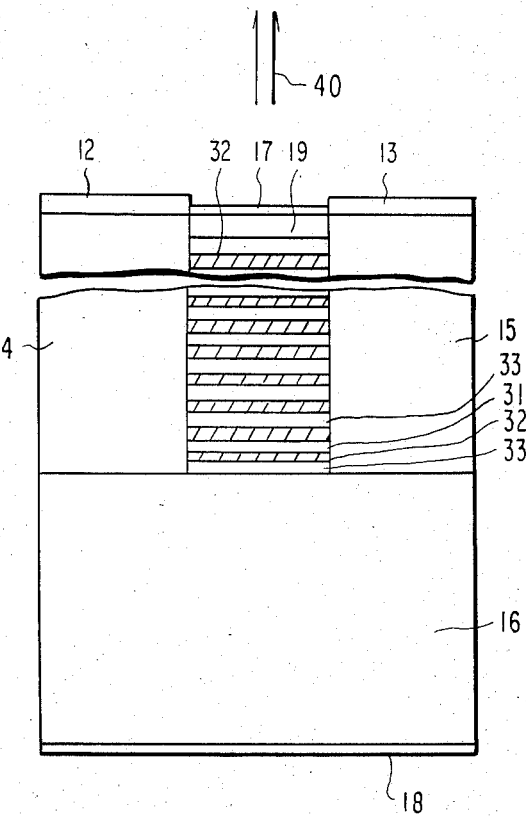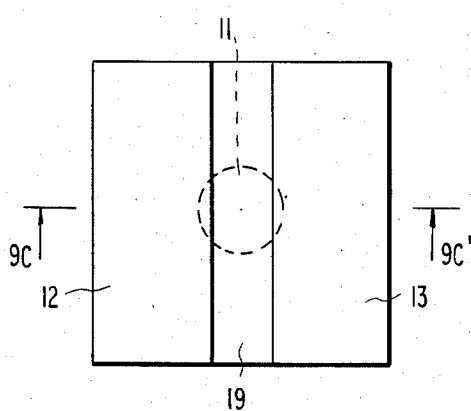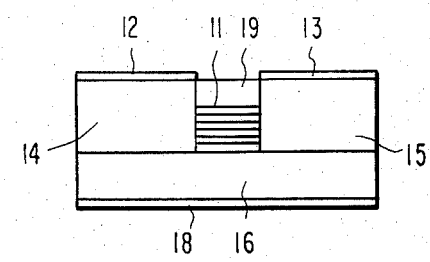

SURFACE-EMITTING SEMICONDUCTOR ELEMENTS

The present invention relates to surface-emitting semiconductor elements which provide their output light beam in a direction normal to the growth plane of the semiconductor.

Surface-emitting semiconductor elements are classified into surface-emitting semiconductor laser diodes (LDs) and surface-emitting light emitting diodes (LEDs). These elements, both of which enable the output light beam to be taken out in a direction normal to the growth plane of the semiconductor, have such advantages as they can be more readily mass produced and have a higher reliability than conventional semiconductor laser diodes and end-emitting diodes, whose optical output has to be taken out of the side plane. The greater ability to mass produce these devices arises from the fact that because, in the case of surface-emitting LDs, the reflecting faces of the semiconductor laser's resonator are not cleavage planes but the front and rear faces of the crystal, the LDs need not undergo cleaving, which is a process incompatible with mass production. Nor in the case of surface-emitting LEDs is the cleaving process required, because either the front or the rear face of the crystal is used as the optical output plane. Their greater reliability lies in that, in the case of surface-emitting semiconductor elements, the active layer where the carrier recombines is not exposed to the outside. In conventional LDs or end face-emitting LEDs, the active layer is exposed at the end face to the atmosphere and, as it is greatly activated, is readily susceptible to optical damage, inviting a deterioration of reliability, but surface-emitting LD's or LDSs are immune from such a deterioration.

However, surface-emitting semiconductor elements of the prior art, because of their structure, have the disadvantage of requiring a very great current for light emission. The best surface-emitting semiconductor laser so far announced is disclosed by Y. Motegi et al in Electronic Letters, Vol. 18, No. 11, 1982, pp. 461~463.

This laser is so structured that electrodes are positioned on the front and rear faces of the semiconductor, and the electric current flows in a direction normal to the layers of the semiconductor. As a result, the region where the laser beam, which travels in a direction normal to the layers, is amplified is limited to the thin pn junction part, and the current flowing between the electrodes is diffused within the face of the active layer to make it difficult to achieve a high current density, so that the amplification is restricted and it is impossible to obtain a surface-emitting LD which can oscillate with a small current.

The surface-emitting diode, reported on by O. Wada et al in the IEEE Journal of Quantum Electronics, Vol. QE-17, No. 2, 1981, pp. 174~178, cannot give a great enough optical output for use in optical fiber communications.

The smallness of optical outputs provided by surface-emitting emitting diodes of the prior art is due to their structure, in which electrodes are positioned on the front and rear faces of the semiconductor and the electric current flows in a direction normal to the layers of the semiconductor. As a consequence, the window from which the optical output is taken out is formed in one of the electrodes, so that the current flows in a circular way and accordingly the light emitting region tends to be formed in a circular shape, resulting in a low efficiency and in the failure to provide a surface-emitting LED with a large optical output.

SUMMARY OF THE INVENTION

Therefore, it is an object of the present invention to provide surface-emitting semiconductor elements with an improved light emitting efficiency.

Another object of the invention is to provide a surface-emitting semiconductor laser which is able to oscillate with a small injection current.

Still another object of the invention is to provide a surface-emitting diode providing a large optical output.

According to the present invention, there are provided a semiconductor light emitting element comprising a semi-insulating semiconductor substrate; a light emitting region, formed over this semi-insulating semiconductor substrate, including at least one active layer which emits light when impressed with a bias voltage; a first semiconductor region of a first conductivity type which adjoins a side face of said light emitting region over said semi-insulating semiconductor substrate and whose bandgap is wider than that of said active layer; a second semiconductor region of a second conductivity type which adjoins another side face of said light emitting region opposite to said side face and whose bandgap is wider than that of said active layer; a first electrode formed over said first semiconductor region; and a second electrode formed over said second semiconductor region.

Further according to a specific feature of the invention, said light emitting region is a multi-layered structure wherein a plurality of active layers are sandwich between first semiconductor layers of the first conductivity type whose bandgaps are wider than those of these active layers and second semiconductor layers of the second conductivity type whose bandgaps are wider than those of the active layers, a multi-layered structure where the second and first semiconductor layers are alternately formed to sandwich each of the active layers in-between in a direction normal to the substrate. On the rear face of the substrate and on the top of said multi-layered structure are formed respectively first and second reflective films, positioned opposite to each other.

According to a more specific feature of the invention, the optical thicknesses of said activated layers, said first semiconductor layers and said second semiconductor layers are equal to $\frac{1}{4}$ of the respective wavelengths of the light emitted.

According to another feature of the invention, the thickness of the active layers is sufficiently thin to produce a quantum size effect.

BRIEF DESCRIPTION OF THE DRAWINGS

FIGS. 6 and 7 show side sections of the faces including the light emitting regions of semiconductor lasers, which are respectively third and fourth preferred embodiments of the invention.

FIGS. 8 and 9 illustrate a surface-emitting diode, which is a fifth preferred embodiment of the invention, and respectively are a plan view and a 9C-9C' section of FIG. 8.

DETAILED DESCRIPTION OF THE PREFERRED EMBODIMENTS

The preferred embodiments of the present invention will be described in detail with reference to the accompanying drawings.

Figure 1:
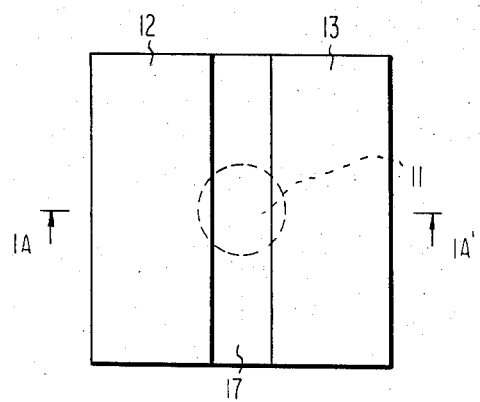
FIG. 1 is a plan view of a semiconductor laser, which is a first preferred embodiment of the present invention.
Figure 2:
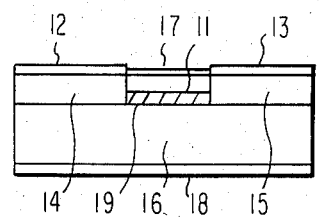
FIG. 2 represents a 1A-1A' section of FIG. 1.

FIGS. 1 and 2 are a plan and a sectional view, respectively, of a surface-emitting semiconductor laser, which is a first preferred embodiment of the invention. The light emitting part 11 of this embodiment is formed over a semi-insulating substrate 16, and emits light upon impression of a bias voltage. The forbidden bandwidths (or bandgap) of the active layers are smaller than that of a semi-insulating semiconductor layer 19. The light emitting part 11, which adjoins a p-type semiconductor part 14 and an n-type semiconductor part 15, has a smaller bandgap than those of both of these semiconductor parts. The top face and other side faces of the light emitting part 11 border on the semi-insulating semiconductor layer 19, which functions as an electric current blockading and passivating film. Further a p-type electrode 12 is formed over the p-type semiconductor part 14, and an n-type electrode 13, over the n-type semiconductor part 15. Over the rear face of the substrate 16 is formed a metal film 18 to constitute one of the reflectors, while over the surface of the semi-insulating semiconductor layer 19 is formed a dielectric multi-layered film 17 to constitute the other reflector. The output light is taken out of the multi-layered film 17. Like in a conventional surface-emitting laser, it is necessary to make the reflectivity of the reflectors sufficiently high.

In this surface-emitting semiconductor laser so structured, a double-hetero structure is formed in a direction parallel to the substrate, and positive holes injected from the p-type semiconductor part 14 and electrons injected from the n-type semiconductor part 15 are both confined in the light emitting part 11 and efficiently recombine to emit light. The recombination of the electrons and positive holes well agrees with the area of high luminous intensity in a resonator composed of the reflective films 17 and 18 to achieve efficient stimulated emission of radiation. This also causes laser oscillation possible with a low electric current. The p-electrode 12 and the n-electrode 13 are insulated from each other by the semi-insulating semiconductors 16 and 19, so that the injected electrons and positive holes efficiently flow into the light emitting part 11.

Highly resistive non-doped InP crystals are used as the semi-insulating semiconductors 16 and 19, and an InGaAsP crystal is used as the light emitting part 11.

Next will be briefly described the process by which this surface-emitting semiconductor laser embodying the present invention is produced. Over the InP semi-insulating substrate 16 is grown a non-doped InGaAsP layer to a thickness of about 10 microns, and its periphery is so removed by etching as to leave the InGaAsP layer 11 measuring 4 microns in diameter. Next, a non-doped InP layer is buried and grown around the InGaAsP layer 11. Into the area of this InP layer to constitute the p-type semiconductor part 14, beryllium is ion-implanted, and into the area to constitute the n-type semiconductor part 15, tin is ion-implanted. The remaining non-doped InP layer 19 would function as a semi-insulating semiconductor. Then, the metal reflective film 18 is deposited on the substrate 16, and so is a dielectric multi-layered film on the surface of the InP layer 19 by the CVD process. Further the p-electrode 12 and n-electrode 13 are formed to compose a semiconductor laser.

Whereas a semi-insulating semiconductor is used in this particular embodiment as the current blockading part 19 on the side face of the light emitting part 11, this part may as well be removed by etching.

Figure 3:
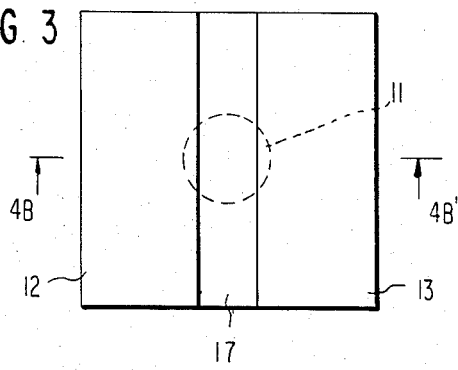
FIG. 3 is a plan view of a semiconductor laser, which is a second preferred embodiment of the present invention.
Figure 4:
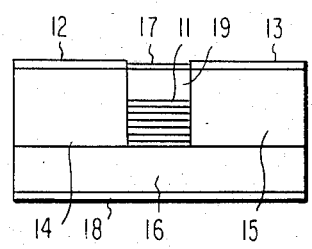
FIG. 4 represents a 4B-4B' section of FIG. 3.
Figure 5:
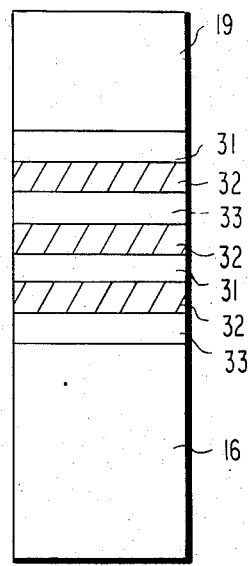
FIG. 5 shows an expanded section of the light emitting region.

FIGS. 3, 4 and 5, showing a second preferred embodiment of the present invention, are a plan view, a sectional view and an expanded illustration of a light emitting part 11, respectively. The light emitting part 11 is formed in multiple layers over a semi-insulating substrate 16, and a p-type semiconductor part 14 and an n-type semiconductor part 15 are in contact with the two side faces of the light emitting part 11, on the top of which is laminated a semi-insulated semiconductor layer 19. The p-type semiconductor part 14, n-type semiconductor part 15, and the semi-insulating semiconductor layer 19 all have wide bandgaps, so that positive holes injected from the p-type semiconductor part 14 and electrons injected from the n-type semiconductor part 15 are both confined in the light emitting part 11.

In the light emitting part 11, as illustrated in FIG. 5, n-type layers 33 have a wide bandgap, active layers 32 having a narrow bandgap, in which the injected electrons and positive holes recombine, p-type layers 31 having a wide bandgap and the semi-insulating layer 19 having a wide bandgap are laminated over the semi-insulating substrate 16 having a wide bandgap.

Positive holes injected from the p-type semiconductor part 14 on the left-hand side of the light emitting part 11 having the above-described multi-layered structure flow into the active layers 32 via the p-type layers 31 having a wide bandgap, while electrons injected from the n-type semiconductor part 15 flow into the active layers 32 via the n-type layers 33 having a wide bandgap. The electrons and positive holes so injected can simultaneously emit light in the plurality of active layers 32, resulting in a greater degree of amplification than a conventional surface-emitting laser having only one active layer. The division of active layers alternately by p-type and n-type semiconductor layers also provides a greater density of inverted population in the active layers than where only one thick active layer is present. The light beams emitted from the active layers 32 travel back and fourth between reflective faces 17 and 18 of a resonator to achieve laser oscillation, and the laser output light beams are sent forth through the reflective face 17. Because of this larger light emitting region than the corresponding part of any surface-emitting laser of the prior art, oscillation can be achieved with a greater laser output.

In this embodiment, InP is used as the semi-insulating semiconductors 16 and 19; zinc-doped InP, as the p-type semiconductor parts 14 and 31 having wide forbidden bands; tin-doped InP, as the n-type semiconductor parts 15 and 33 having wide forbidden bands, and InGaAsP, as the active layers 32.

Next will be briefly described the process by which the surface-emitting semiconductor laser of the foregoing embodiment of the invention is produced. Over the InP semi-insulating substrate 16 are successively laminated an n-InP layer 33, an InGaAsP layer 32, a p-InP layer 31, another InGaAsP layer 32, another n-InP layer 33, still another InGaAsP layer 32 and another p-InP layer 31 of 2 μm each. Then the part surrounding the light emitting part 11 is so removed by etching as to leave a column of 4 microns in diameter. Next, a non-doped InP layer is buried and grown around the light emitting part 11. Further, beryllium is ion-implanted into the area that would constitute the p-type semiconductor part 14, and so is tin into what would constitute the n-type semiconductor part 15. Therefore the remaining part of the non-doped InP layer is the semi-insulating semiconductor 19. Then a p-type electrode 12 and an n-type electrode 13 are formed.

Although InP and InGaAsP are used in the foregoing embodiment, other mixed crystals including GaAlAs and GaAs can obviously be used as well. In the latter case, a buffer layer which has a wider bandgap than that of the active layer is needed to confine the carrier in the active layer. Because GaAs substrate has the narrowest bandgaps among the GaAlAs and GaAs crystals, the buffer layer is placed between the substrate and the active layer.

The number of the active layers 32 is three in the foregoing embodiment, but it is not limited to three.

Though the p-type semiconductor part 14 and the n-type semiconductor part 15 on the two sides of the light emitting part 11 are formed by ion implantation in the foregoing embodiment, they can alternatively be buried by selective growth.

There are no limitations on the thickness of each layer or on the number of layers in the light emitting section 11, which are respectively 2 μm and seven in the foregoing embodiment.

FIG. 6 illustrates a third preferred embodiment of the present invention. It shows a section including a light emitting part. The structure of this embodiment differs from that of the second embodiment firstly in that more of the n-InP layers 33, InGaAsP active layers 32 and p-InP layers 31 are formed in the light emitting part, secondly in that the thickness of each of these layers is so determined as to be equal to ¼ of the peak wavelength of the emitted light in the pertinent medium, and thirdly in the absence of a reflective film opposite to the reflective film formed on the substrate. Electrons and positive holes are injected respectively from an n-type semiconductor part 15 and a p-type semiconductor part 14, both having wide forbidden bands. The electrons injected from the n-type semiconductor part 15 flow into the n-type layers 33 having a small refractive index and a wide bandgap, and further into the active layers 32 having large refractive index and a narrow bandgap. The positive holes injected from the p-type semiconductor part 14 flow into the p-type layers 31 having a small refractive index and a wide bandgap, and further into said active layers 32 to recombine with the injected electrons to emit light. Since each layer is so formed as to be as thick as ¼ of the peak wavelength of the light emitted in the pertinent medium, only that part of the light emitted having the corresponding wavelength undergoes the Bragg reflection to achieve laser oscillation. As on this occasion the Bragg reflection takes place on the reflective face formed by the boundaries, normal to the direction in which the light travels, of the layers, theoretically there is achieved a very high diffractive efficiency.

Since the structure described above is obtained by growing multiple layers of the thin films 33, 32 and 31 over the flat substrate 16, there is no need to grow such layers over a corrugated surface, with the result that the crystals are hardly susceptible to defects and accordingly there is provided a laser having a high light emitting efficiency and a long useful life.

In this embodiment, InGaAsP is used as the active layers 32; zinc-doped InP, as the p-type layers 31; sulphur-doped InP, as the n-type layers 33; beryllium-doped InP, as the p-type semiconductor part 14; tin-doped InP, as the n-type semiconductor part 15; and a semi-insulating substrate as the semi-conductor crystal substrate 16.

Next will be briefly described the process by which the foregoing embodiment of the present invention, a distributed feedback type surface-emitting laser is produced. Over the InP semi-insulating substrate 16 are laminated altogether 49 layers in cycles of a 1030-angstrom thick n-InP layer 33, a 960-angstrom $In_{0.74}Ga_{0.26}As_{0.56}P_{0.44}$ layer 32, a 1030-angstrom p-InP layer 31 and a 960-angstrom $In_{0.74}Ga_{0.26}As_{0.56}P_{0.44}$ layer 32 in that order. Next the surrounding part is etched off to leave a column of 4 microns in diameter. Then non-doped InP is buried and grown around the column. Further, beryllium is ion-implanted into a part of the non-doped InP and so is tin into another part to form the p-type semiconductor part 14 and the n-type semiconductor part 15, respectively, by thermal diffusion. After that, a p-type electrode 12 and an n-type electrode 13 are further formed.

Although the number of layers is 49 in the foregoing embodiment, it obviously need not be restricted to 49.

Since reflection is achieved by the primary Bragg diffraction in the foregoing embodiment, the thickness of each layer is about 1000 angstroms, but it also is possible to use a secondary or higher-order diffraction.

FIG. 7 is a quantum well type surface-emitting semiconductor laser, which is a fourth preferred embodiment of the present invention. It shows a side section including the light emitting part of the laser. The structure of this embodiment differs from that of the second embodiment firstly in that more of the n-InP layers 33, InGaAsP active layers 32 and p-InP layers 31 are formed in the light emitting part, and secondly in that the films of the active layers are so thin as to permit the quantum size effect to manifest itself.

Electrons and positive holes are injected respectively from an n-type semiconductor part 15 and a p-type semiconductor part 14, both having wide bandgaps. The electrons injected from the n-type semiconductor part 15 flow into the n-type layers 33 having a wide bandgap, and further into the active layers 32 having a narrow bandgap. The positive holes injected from the p-type semiconductor part 14 flow into the p-type layers 31 having a wide bandgap, and further into the active layers 32 to recombine with the injected electrons to emit light.

The active layers 32 are formed thin enough for the quantum size effect to manifest itself. The proper film thickness for achieving the quantum size effect at room temperature, T(K), has to satisfy the following equation:

$$Lz \leq \sqrt{\frac{3}{8}} \frac{h}{\sqrt{kTm}} \tag{1}$$

where Lz is the thickness of each active layer 32; h, Plank's constant; k, Boltzman's constant; T, temperature, and m, the effective mass of electrons in the crystal of the active layer 32. In an InGaAsP crystal, for example, m is about equal to 7% of the electron weight, and these values indicate that the proper thickness Lz of each active layer at room temperature (300° K.) should be thinner than 170 angstroms.

Because of the presence of a plurality of the light-amplifying active layers 32, a light beam travelling in a direction normal to the layers is amplified plural times, and is reflected by the reflectors formed on the front and rear sides to effect laser oscillation. To produce this embodiment, altogether 199 layers are laminated by the vapor-phase epitaxial growth method over an InP semi-insulating substrate 16 in cycles of a 500-angstrom thick n-type InP layer 33, a 100-angstrom $In_{0.74}Ga_{0.26}As_{0.56}P_{0.44}$ layer 32, a 500-angstrom p-InP layer 31 and a 100-angstrom $In_{0.74}Ga_{0.26}As_{0.56}P_{0.44}$ layer 32 in that order. Next the surrounding part of said 199 layers is etched off to leave a column of 4 microns in diameter. Then non-doped InP is buried and grown around said column. Further, beryllium is ion-implaned into a part of the non-doped InP and so is tin into another part to form the p-type semiconductor part 14 and the n-type semiconductor part 15.

Although the number of layers is 199 in the foregoing embodiment, it obviously need not be restricted to 199.

The thickness of each active layer 32 is set at 100 angstroms to achieve the quantum size effect in the foregoing embodiment, the thickness is not necessarily restricted to this value as long as the foregoing Equation (1) is satisfied.

The thicknesses of each n-type InP layer 33 and each p-type InP layer are supposed to be 500 angstroms in the foregoing embodiment, they are not confined to this value either.

Next will be described another preferred embodiment, in which the present invention is applied to a surface-emitting diode.

This embodiment illustrated in FIGS. 8 and 9 has a structure closely resembling that of the second preferred embodiment shown in FIGS. 3 through 5. The only difference is the absence in this embodiment of a reflective film on its semi-insulating semiconductor layer 19, unlike in the second embodiment. Therefore, this element functions as a light emitting diode, but not as a laser. A light emitting part 11 here, laminated in the order of an n-InP layer, an InGaAsP active layer, a p-InP layer, an InGaAsP active layer, an n-InP layer, an InGaAsP layer and a p-InP layer, is identical in structure with what is shown in FIG. 5. In this embodiment, the diameter of the light emitting part to be left un-etched is relatively large, 10 microns to be exact.

Further, there can also be realized a surface-emitting diode, wherein the thickness of each active layer is sufficiently reduced for the quantum well effect to manifest itself and the number of such layers is increased. In this case, if the structure having no reflective film 17 as shown in FIG. 7 is used, the structure and production process described with respect to the fourth preferred embodiment can be directly utilized.

What is claimed is:

1. A surface-emitting semiconductor light emitting element comprising:
   a semi-insulating semiconductor substrate;
   a light emitting region, formed over said semi-insulating semiconductor substrate, and including at least one active layer which emits light when impressed with a bias voltage;
   a first semiconductor region of a first conductivity type adjoining, in the direction of the thickness of said active layer, a side face of said light emitting region and formed over said semi-insulating semiconductor substrate, said first semiconductor region having a wider bandgap than that of said active layer;
   a second semiconductor region of a second conductivity type adjoining, in the direction of the thickness of said active layer, another side face of said light emitting region opposite to said side face and formed over said semi-insulating semiconductor substrate, said second semiconductor region having a wider bandgap than that of said active layer;
   a semi-insulating semiconductor region adjoining, in the direction of the thickness of said active layer, the remaining portion of said light emitting region and separating said first semiconductor region from said second semiconductor region, said semi-insulating semiconductor region having a wider bandgap than that of said active layer;
   a first electrode formed over said first semiconductor region; and
   a second electrode formed over said second semiconductor region.

2. The surface-emitting semiconductor element as claimed in claim 1, further comprising a semi-insulating semiconductor layer over said light emitting region.

3. The surface-emitting semiconductor element, as claimed in claim 2, wherein said light emitting region includes a multi-layered structure of a plurality of active layers sandwich between first semiconductor layers of the first conductivity type whose bandgaps are wider than those of said active layers and second semiconductor layers of the second conductivity type whose bandgaps are wider than those of said active layers, said second and first semiconductor layers being alternately formed to sandwich each of said active layers in-between in a direction normal to the substrate.

4. The surface-emitting semiconductor element, as claimed in claim 3, wherein the optical thicknesses of said active layers, said first semiconductor layers and said second semiconductor layers are equal to $\frac{1}{4}$ of the respective wavelengths of the light emitted.

5. The surface-emitting semiconductor element as claimed in claim 4, wherein said semi-insulating semiconductor sbustrate and said semi-insulating semiconductor layer are non-doped layers of InP; said active layer is InGaAsP crystal; said first semiconductor region is beryllium doped InP; and said second semiconductor layer is tin doped InP.

6. The surface-emitting semiconductor element as claimed in claim 5, wherein said first and second semiconductor layers are zinc doped InP and tin doped InP, respectively.

7. The surface-emitting semiconductor element as claimed in claim 6, wherein said active layers and said first and second semiconductor layers are approximately 1000Å thick.

8. The surface-emitting semiconductor element, as claimed in claim 3, wherein the thickness of the active layers is sufficiently thin to produce a quantum size effect.

9. The surface-emitting semiconductor element as claimed in claim 8, wherein said semi-insulating semiconductor substrate and said semi-insulating semiconductor layer are non-doped layers of InP; said active layer is InGaAsP crystal; said first semiconductor region is beryllium doped InP; and said second semiconductor layer is tin doped InP.

10. The surface-emitting semiconductor element as claimed in claim 9, wherein said first and second semiconductor layers are zinc doped InP and tin doped InP, respectively.

11. The surface emitting semiconductor element as claimed in claim 10, wherein said active layers are thinner than about 170Å.

12. The surface-emitting semiconductor element as claimed in claim 2, including a first reflective film formed on the rear face of said substrate and a second refelctive film formed on the top of said semi-insulating semiconductor layer to be opposite to said first reflective film.

13. The surface-emitting semiconductor element as claimed in claim 12, wherein, said semi-insulating semiconductor substrate and said semi-insulating semiconductor layer are non-doped layers of InP; said active layer is InGaAsP crystal; said first semiconductor region is beryllium doped InP; and said second semiconductor layer is tin doped InP.

14. The surface-emitting semiconductor element, as claimed in any of claims 3, 4, 5, 6, 7, 8, 9, 10 or 11, inlcuding a first reflective film formed on the rear face of said substrate and a second reflective film formed on the top of said semi-insulating semiconductor layer to be opposite to said first reflective film.

15. The surface-emitting semiconductor element as claimed in any of claims 3, 4, 5, 6, 7, 8, 9, 10 or 11, including a reflective film formed on the rear face of said substrate.

* * * * *